(12) United States Patent
Taillibert et al.

(10) Patent No.: US 6,172,966 B1
(45) Date of Patent: Jan. 9, 2001

(54) DIAGNOSIS OF NETWORKS OF COMPONENTS, WITH STRIPWISE MODELING

(75) Inventors: Patrick Taillibert, Marly le Roi; Etienne Loiez, Lille, both of (FR)

(73) Assignee: Dassault Electronique, Saint Cloud (FR)

( * ) Notice: Under 35 U.S.C. 154(b), the term of this patent shall be extended for 0 days.

(21) Appl. No.: 08/983,154

(22) PCT Filed: May 15, 1996

(86) PCT No.: PCT/FR96/00736

§ 371 Date: Jan. 14, 1998

§ 102(e) Date: Jan. 14, 1998

(87) PCT Pub. No.: WO97/43659

PCT Pub. Date: Nov. 20, 1997

(51) Int. Cl.[7] .................................................. H04J 3/14
(52) U.S. Cl. .................. 370/252; 370/242; 364/578; 364/579; 371/22.4; 371/24; 371/25.1
(58) Field of Search ..................................... 370/252, 241, 370/242, 243, 244, 245, 246; 364/500, 551.01, 551.02, 578, 579, 580; 371/22.1, 22.4, 22.5, 24, 25.1

(56) References Cited

U.S. PATENT DOCUMENTS

| | | | |
|---|---|---|---|
| 5,046,034 | * 9/1991 | Stark et al. | 364/580 |
| 5,214,653 | 5/1993 | Elliott, Jr. et al. | 371/15.1 |
| 5,327,437 | 7/1994 | Balzer | 371/25.1 |
| 5,412,802 | 5/1995 | Fujinami et al. | 395/575 |
| 5,566,092 | * 10/1996 | Wang et al. | 364/551.02 |
| 5,602,761 | * 2/1997 | Spoerre et al. | 364/551.01 |

FOREIGN PATENT DOCUMENTS 0408425  1/1991  (EP) .............................. G01R/31/28

* cited by examiner

Primary Examiner—Douglas W. Olms
Assistant Examiner—Shick Hom
(74) Attorney, Agent, or Firm—Christie, Parker & Hale, LLP

(57) ABSTRACT

An n-tuple defines an envelope of a variable over a time interval. An input memory receives blocks of measurements made at known points of the network and converts them into initial n-tuples. In a base memory, a functional model comprises a list of components, ($L_v$), and the designation (Df, Dg) of at least one particular function of the measurements ($L_p$). Management will, repetitively, (a) match together available initial n-tuples, and at least one model applicable to them, (b) through computations on n-tuples, with the function designation (Df, Dg) of the model, and these n-tuples, obtain at least one result n-tuple (Nf, Ng), (c) apply the result n-tuple (Nf, Ng) to test for a standard expression, and (d) associate the output from the test with the list of components ($L_v$) of the model. Decision logic analyzes various outputs from the test, with a view to determining one or more defective components.

13 Claims, 5 Drawing Sheets

DIAGNOSIS OF NETWORKS OF COMPONENTS, WITH STRIPWISE MODELING

BACKGROUND OF THE INVENTION

The invention relates to the automatic diagnosis of networks of components.

A diagnosis device capable of operating on analogue signals is described in an European Application (EP-A-408 425). It works on the basis of functional models. These comprise component-expressions pertaining to physical quantities relating to a component, such as Ohm's law (V=I.R); they also comprise law-expressions representing general relations between physical quantities, such as the Kirchhoff's first law; the algebraic sum of the currents at a node is zero.

Diagnosis begins from acquired physical quantities. These are stored in memory in the form of samples, matched up with a corresponding specification of the relevant nodes and components of the network.

If the device works "blind" (without knowing a priori the layout of the network), the specification of the nodes and components must be sufficient to allow it to learn the layout of the network along with its exploration of the latter. If, on the contrary, the layout of the network is known in advance, it is sufficient to designate each measurement point in this known layout.

For each acquisition, the samples are referred to a chosen working time interval. The device searches therein for anomalies with respect to the functional models (law-expressions and component-expressions). This is done for each sampling instant in the working time interval.

Generally, the samples of physical quantities acquired do not lend themselves directly to the detection of anomalies. First, it is necessary to compute estimated physical quantities, as many as necessary so as no longer to have any unknowns. A violated expression then makes it possible in principle, bearing in mind the uncertainties, to locate the fault.

The aim is to locate a defective component in the relevant network and to do so in minimum time.

However, it has transpired that difficulties persisted for certain applications.

First, the prior device functions by "propagation": for each sampling instant it is necessary, starting from the measured samples, to compute as many estimated quantities as necessary, and then to work iteratively on the models until the faulty component is found. It is clear that the number of operations, and consequently the time elapsed, grow very quickly, as the complexity of the circuit to be analysed increases.

Moreover, to produce the functional models it is necessary to "bracket" certain variables, that is to say fix a minimum and a maximum in respect thereof. Now, in certain situations, analogue signals (voltage or current) vary very rapidly. It transpired that bracketing their derivatives then becomes particularly tricky, especially when uncertainty is taken into account.

These difficulties are made worse by the fact that, in most cases, there is furthermore reason to consider uncertainty ranges rather than raw values.

They are made worse also each time that it is necessary to bring into the models not only the quantities themselves, but also their first derivatives (or higher-order derivatives), as is often the case. It is often difficult to bracket such derivatives by uncertainty ranges, in the presence of fast variations in the basic quantities themselves.

SUMMARY OF THE INVENTION

The purpose of the present invention is especially to afford a solution to these problems.

The device proposed is of the known type including:
- an input memory for receiving blocks of measurements (in the prior art, packets of digital samples), each of which represents measurements of a physical quantity made at a known location of the network,
- a base memory for storing the definition of functional models relating to the network, and
- processing means capable of determining whether a functional model is or is not satisfied by one or more blocks of measurements, so as to identify a possible fault in one at least of the components of the network.

The invention makes use first of a specific representation of the measurement blocks, in the form of n-tuples. An n-tuple represents the time evolution of a variable, on the basis of a string of numbers, which defines a time interval, and an envelope of the variable over this time interval. The device furthermore includes means of computing on n-tuples, which means may be regarded as subsumed within the processing means, or as tool separate from the latter.

The device of the invention also includes test means able to receive one or more n-tuples (Nf, Ng), and to yield an output relating to the satisfying of a standard expression by these n-tuples. It will be seen that these test means can operate without exhaustively examining the contents of the envelopes which this or these n-tuples (Nf, Nf) represent.

In the input memory, each block of measurements is stored in the form of at least one initial n-tuple.

In the base memory, the definition of a functional model comprises a list of components ($L_v$), and the designation (Df, Dg) of at least one particular function of the measurable quantities ($L_p$). Associated with the standard expression of the test means, this particular function defines the equation of the model.

Finally, the processing means comprise:
- management means capable, repetitively,
  - of cooperating with the base memory, so as to match up the available initial n-tuples, and at least one model applicable to the measurable quantities which these n-tuples represent,
  - of deploying the computations on n-tuples, with the function designation (Df, Dg) of the model, and these n-tuples, to obtain at least one result n-tuple (Nf, Ng),
  - of applying the result n-tuple (Nf, Ng) to the test means, and
  - of associating the output from the test means with the list of components ($L_v$) of the model,
- as well as decision logic, capable of analysing various outputs from the test means, with a view to determining one or more defective components.

Very advantageously, the models pertain solely to directly measurable quantities; similarly, each measurable quantity enters at most once into each function designation (Df, Dg) of a model.

Subsequently, for the initial n-tuples, the envelope is delimited as a trapezium, with vertical bases in an amplitude/time graph. It will be seen that this corresponds to an n-tuple of order 1.

The device can also include means for receiving or constructing a map of a network to be diagnosed, and a generator of model-relations from this map and from physical laws regarding the components of the network.

In the currently preferred embodiment, the test means and the function designations together define a standard structure of differential equations, such as $f( )+g'( )=0$. Consequences to which we shall return later result from this.

Other characteristics and advantages of the invention will emerge on examining the detailed description below, and the drawings.

DETAILED DESCRIPTION

The appended drawings are in essence of definite character, they therefore form an integral part of the present description and will be able to contribute to the definition of the invention.

The descriptive content of EP-A-408 425 should be regarded as incorporated into the present description, in respect of the elements of a diagnosis device (or test device) which are already described therein.

The invention will be described below by way of example within the context of a network of electronic components. It can find numerous other applications.

Figure 1:
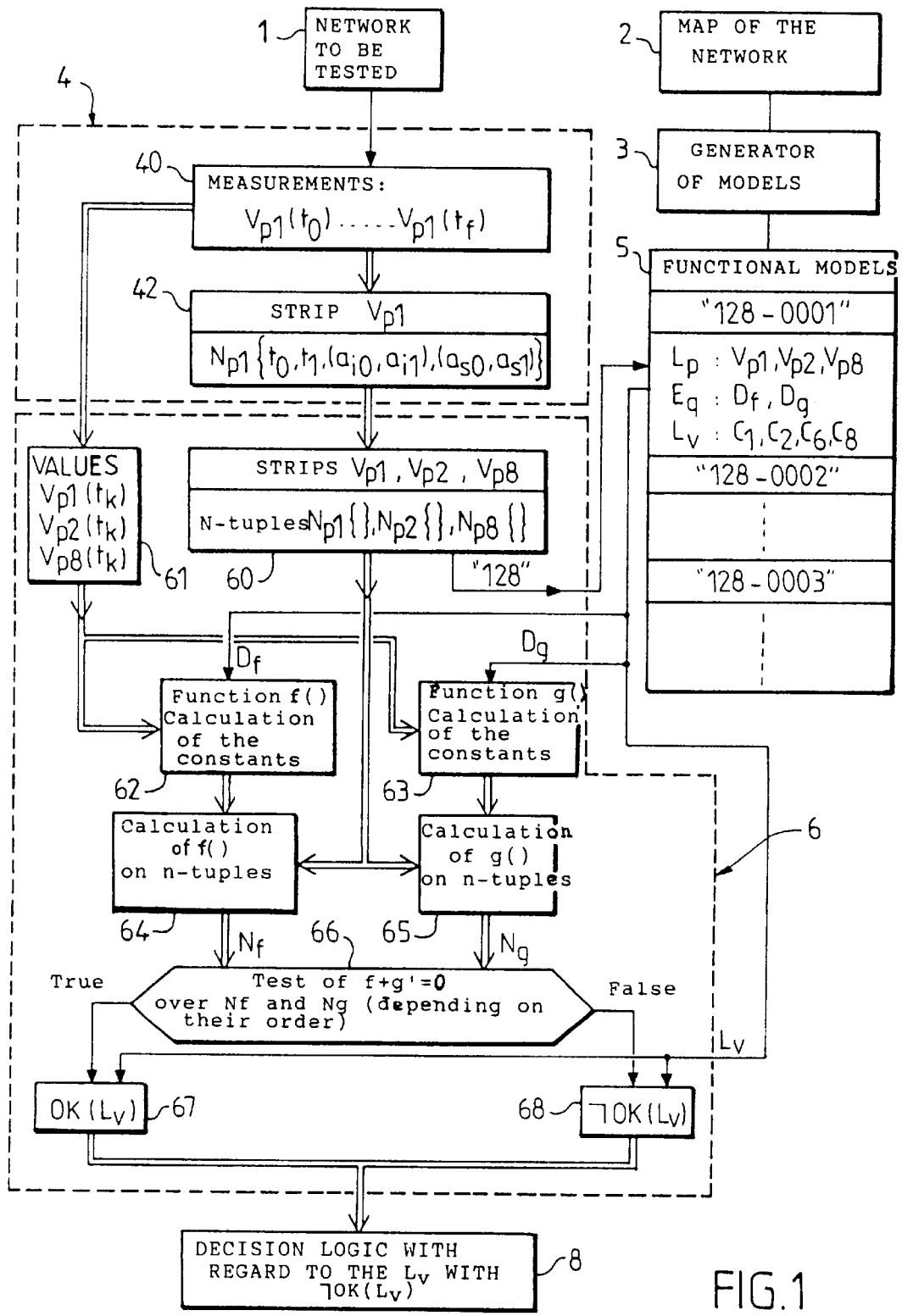
FIG. 1 is a general layout of the device according to the invention.

In FIG. 1, the reference 1 designates a network of interconnected electronic components to be tested. In a known manner, available at 2 is a computerized representation or "map" of this network.

Because the current strengths are not often measured directly, the text below will refer only to electrical voltages. The term "measurable quantity" will therefore refer to an electrical voltage which is directly measurable at a point of the network. It will also be considered that all the voltage measurements are made with reference to the same common point, such as the earth. Were it otherwise, it would be necessary to associate a pair of points with each voltage measurement.

At 4, the device includes an input memory 40, for receiving blocks of consecutive samples of an electrical voltage $Vp_1$ measured as a function of time (from $t_0$ to $t_f$). With each block of samples is associated the designation of the relevant location or measurement point $p_1$. Moreover, the measurement is marred by uncertainty (known, not represented).

The invention makes use first of a particular representation of the measurements, in strips, which will be stored in the memory 42.

Figure 2:
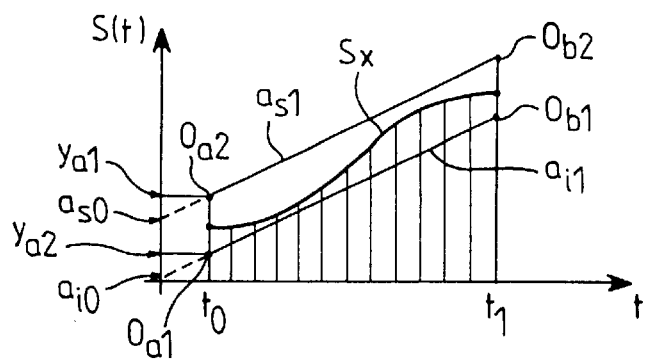
FIGS. 2, 3 and 4A to 4C are amplitude/time graphs illustrating the definition and role of the n-tuples.

Consider an arbitrary measurement $S_x(t)$. It is always possible to represent this measurement, bearing in mind its uncertainty, as an envelope (FIG. 2, where the vertical bars are a reminder that the measurement is made up of samples).

The Applicant proposes that this envelope (FIG. 2) be defined as the relevant time interval $[t_0, t_1]$, and, as a suitable representation of the support lines of the segments $O_{a1} O_{b1}$ and $O_{a2} O_{b2}$. The envelope is thus delimited by the trapezium whose parallel bases are the vertical segments $O_{a1} O_{a2}$ and $O_{b1} O_{b2}$, and whose other sides are the straight lines $O_{a1} O_{b1}$ and $O_{a2} O_{b2}$.

These envelopes are figuratively referred to as "strips". Thus, an n-tuple of values will be matched up with a strip-like domain circumscribed about the evolution of the relevant variable over a defined duration.

The representation of the support lines for the segments $O_{a1} O_{b1}$ and $O_{a2} O_{b2}$ could be effected by the ordinates ($y_{a1}$, $y_{a2}$) at the points $t_0$ and $t_1$, together with the slopes ($a_{i1}$, $a_{s1}$) of these two straight lines, or else by $y_{a1}$, $y_{a2}$, $y_{b1}$, $y_{b2}$. It is currently preferred to use the ordinates at the origin ($a_{i0}$, $a_{s0}$) and the slopes ($a_{i1}$, $a_{s1}$) of the lower line (subscript i) $O_{a1} O_{b1}$ and upper line (subscript s) $O_{a2} O_{b2}$.

The envelope of the signal $S_x$ is completely defined by the quantities ($t_0, t_1, (a_{i0}, a_{i1}), (a_{s0}, a_{s1})$), which together form an n-tuple $N_x$ (or a vector in the mathematical, but not the geometrical sense of the word).

In fact, the envelope being delimited by straight line segments, a measurement $S_x(t)$ will often have to be bracketed by a sequence of successive envelopes (FIG. 3), each of which closely brackets the measurement, bearing in mind the uncertainty therein.

The construction of an n-tuple $N_x$ in respect of a given signal $S_x$ can be effected by known means. It is simple if $O_{a1} O_{b1}$ and $O_{a2} O_{b2}$ are straight line segments: for example, it is possible to take the regression line associated with the signal $S_x$, and to obtain the two segments, by respectively subtracting from and adding to this regression line an amount sufficient to encompass all the samples of $S_x$.

Computations can be performed directly on these n-tuples.

First, it is easy to subdivide the n-tuple $N_x$ of a signal $S_x$ into several n-tuples $N_{x1}$ and $N_{x2}$ corresponding to subsets of the time interval $[t_0, t_1]$ of the n-tuple $N_x$. It suffices to modify $t_0$ and $t_1$ in the result n-tuples (relations I appended).

Similarly, from two n-tuples (or more) relating to consecutive time intervals (a "sequence of n-tuples") it is also possible to create an n-tuple representing the set of values of a quantity, over the global time interval.

From measurements relating to time intervals which overlap, but do not coincide, it is therefore possible to construct n-tuples which all relate to the same time interval, and these will be referred to as "synchronous" n-tuples.

Figure 4A:
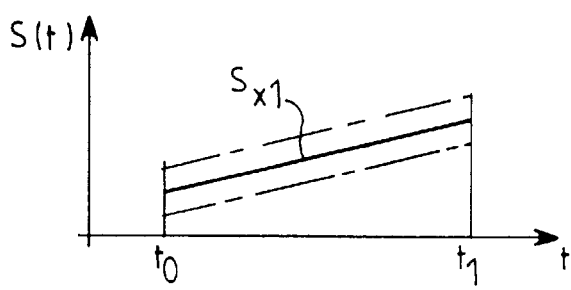
Figure 4B:
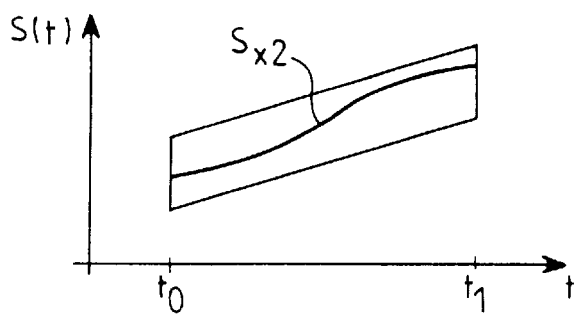
Figure 4C:
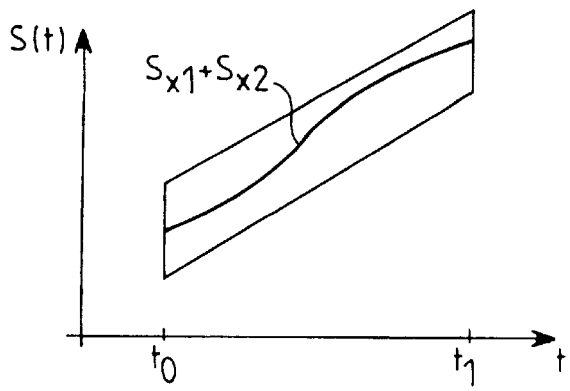

Incidentally, it will be observed that, for a group of synchronous n-tuples, a change of variable makes it possible to arrange for $t_0=0$. Next, for a signal $S_y$ equal to the sum of signals $S_{x1}$ and $S_{x2}$, it is possible directly to compute the n-tuple $N_y$, from the n-tuples $N_{x1}$ and $N_{x2}$ (FIGS. 4A to 4C and relations II appended). It is possible to do the same in respect of signal multiplication (not represented).

Finally, it is possible to determine a bracketing of the integral of the signal $S_x$ from its n-tuple $N_x$. This integral lies between those of the lower curve $O_{a1} O_{b1}$ and upper curve $O_{a2} O_{b2}$ of the envelope. These integrals are easily computed, as will be seen further on in the general case.

If the two straight line segments are horizontal and parallel, the strip becomes of order "zero". Moreover, the associated n-tuple of order "zero" can be defined through the four parameters $\{t_0, t_1, (b_{i0}), (b_{s0})\}$ alone. This n-tuple of order zero will be distinguished from the interval of real numbers $[b_{i0}, b_{s0}]$, which is defined independently of time.

A strip delimited by straight line segments of non-zero slope is of order 1. The corresponding n-tuple is also of order 1.

It is also known how to define the segments $O_{a1} O_{b1}$ and $O_{a2} O_{b2}$ over polynomial curves of order p (greater than 1, which corresponds to a straight line). This will then produce a strip and an n-tuple of order p, defined by the appended expressions (III). Such an n-tuple of order p possesses 2.(p+2) parameters (time interval included). The lower (coefficients $a_i$) and upper (coefficients $a_s$) polynomial curves bracket the quantity x(t) over the whole time interval $[t_0, t_1]$.

Relation (IV) defines the addition of two synchronous n-tuples of order p.

Relation (V) defines the n-tuple associated with the integral of an n-tuple, between an origin instant $\Theta_0$ and the instant t (lying between $t_0$ and $t_1$). It will be noted that the result simplifies considerably if $\Theta_0=0$ (relation VI).

It is also possible to define the product of an n-tuple of order p and a real number $b_{i0}$.

We first consider the case of an n-tuple of order 1, for which the envelope represented by the n-tuple of order 1 is entirely positive ("entirely positive n-tuple").

The product of such an n-tuple of order 1 and a positive real number $b_{i0}$ is defined by relation (VII). If $b_{i0}$ is a negative real, the subscripts i and s are interchanged in the result.

The case in which:
the n-tuple is entirely negative,
over the whole of the time interval $[t_0, t_1]$ of the n-tuple, the envelope contains the zero ("the n-tuple contains zero")
can be treated analogously, taking into account the rules regarding the sign of a product and of an inequality ("<" or ">").

An n-tuple which is entirely positive, or else entirely negative, or else contains the zero is thus categorized as monotonic. An arbitrary n-tuple can be decomposed into a series of monotonic n-tuples to which the multiplication rules defined here apply.

It is also possible to define the product of an n-tuple of order 1 and an interval $[b_{i0}, b_{s0}]$.

If $b_{i0}$ and $b_{s0}$ are positive, and if the n-tuple is entirely positive, the product is defined by relation (VII): the lower values (subscript i) are multiplied together and the upper values (subscript s) are multiplied together.

From this may be deduced as before what happens if $b_{i0}$ and $b_{s0}$ are negative and/or in the other cases of monotonic n-tuples, bearing in mind the rules regarding the sign of the products and of the inequalities.

It is also known how to define similarly the product of an entirely positive or entirely negative n-tuple and an interval which contains the zero, again bearing in mind the rules regarding the sign of the products and of the inequalities.

There remains the case of the product of an n-tuple which contains the zero and an interval $[b_{i0}, b_{s0}]$ which contains the zero. In this case, we compare, for every t over the time interval $[t_0, t_1]$:

$b_{i0} (a_{i0}+a_{i1} t)$ with $b_{s0} (a_{s0}+a_{s1} t)$
$b_{s0} (a_{i0}+a_{i1} t)$ with $b_{i0} (a_{s0}+a_{s1} t)$ If the two comparisons keep the same sign, it is possible to calculate the result n-tuple, as before, bearing in mind the rules regarding the sign of the products and of the inequalities.

Otherwise, the operand n-tuple must be split into several n-tuples satisfying the above property. The result is then a sequence of n-tuples.

The product of a strip (n-tuple) of order p and an interval is defined similarly. This product corresponds to a splitting of this strip into a series of strips if either the interval or the strip contain the zero. Thus, the single starting strip is transformed into a sequence of 1 to 5 strips. The splitting mechanism involves solving a polynomial equation of degree equal to that of the strip. The solution procedure will be analytic up to degree 4 and subsequently numerical, using iterative methods of the Newton or similar kind.

Although an interval and an n-tuple of order zero are different, the product of an n-tuple of order p and an n-tuple of order zero, of the form $\{t_0, t_1, (b_{i0}), (b_{s0})\}$ obeys the same rules as the product of an n-tuple of order p and an interval.

More generally still, it is possible to define the product of an n-tuple (or strip) of order p and an n-tuple of order q. It yields a strip whose order is (p+q). Moreover, a splitting into a sequence of strips is introduced as soon as one or other of the operand strips contains the zero. The solution procedure is performed according to the same principles as before.

In short, the Applicant Company has been able in particular to define the following operations or relations, on synchronous n-tuples:

equality of n-tuples, addition of two n-tuples (or more), multiplication of an n-tuple by a real scalar (a physical or mathematical constant), multiplication of an n-tuple of any order by an interval (the value of a resistor, for example, with its uncertainty), multiplication of two n-tuples of any orders, integral of an n-tuple.

The n-tuples are not synchronous a priori. It is therefore necessary to be able to consider sequences of n-tuples (or sequences of temporal strips). It is also known how to define:

the equality of two sequences of n-tuples;

the equivalence of two sequences of n-tuples (they define the same envelope, with different temporal splittings), the addition of two sequence of n-tuples (or more), the multiplication of a sequence of n-tuples by a real scalar, the multiplication of a sequence of n-tuples of any order by an interval, the multiplication of two sequences of n-tuples of any orders.

It is important to note that these operations on n-tuples or strips do not by themselves introduce any additional uncertainty.

Moreover, starting from an n-tuple, the said operations give either an n-tuple or a sequence of n-tuples (multiplications, in particular). Starting from a sequence of n-tuples, a sequence of n-tuples is always obtained.

Returning to FIG. 1, the input measurements may be envisaged as arriving directly in the form of n-tuples. The Applicant Company currently prefers to store at 40 the samples themselves. A unit 42 converts them into corresponding n-tuples which it stores.

Starting from a given block of input samples $(V_{p1}(t_0), \ldots V_{p1}(t_f))$ the conversion operator (42) is designed to operate an optimization between the number of n-tuples and their span along the ordinate. To simplify the account, it will be supposed below that each block of input samples is represented by a single n-tuple (or strip).

Hence, several strips relating to points $p_1$, $p_2$ and $p_8$ of the network will be available, for example (FIG. 1).

Moreover, in a predetermined manner, or by learning (not represented) in tandem with the measurements, a map of the network is available at 2.

The models are now considered.

The basic models are defined by physical laws. Simple rules make it possible to designate the quantities which are directly measurable: for example, in electronics these are the voltages alone, under the proviso of the accessibility of the measurement point, which is a matter for the map of the network.

With the aid of formal computation software, such as MATHEMATICA or MAPLE (registered trade marks), sold by WOLFRAM RESEARCH, or WATERLOO MAPLE, it is generally possible to solve the theoretical equations so as to give expression to the "reduced equations" satisfying the following condition: each reduced equation involves only directly measurable quantities.

Each reduced equation will then be converted into a model-relation, as indicated below.

Although just one or a few model-relations may suffice for the diagnosis of a set of components, the Applicant currently prefers to make available a large number of model-relations, better still all the possible model-relations for each set of components. (All the possible model-relations is understood here under the aforesaid limitations: measurable quantities only, and each quantity entering once only).

Advantageously, matters will be arranged such that a measurable quantity (or one of its derivatives, or one of its integrals) enters a reduced equation once only. That is to say the measurable quantities are "factorized" to the maximum.

Figure 5:
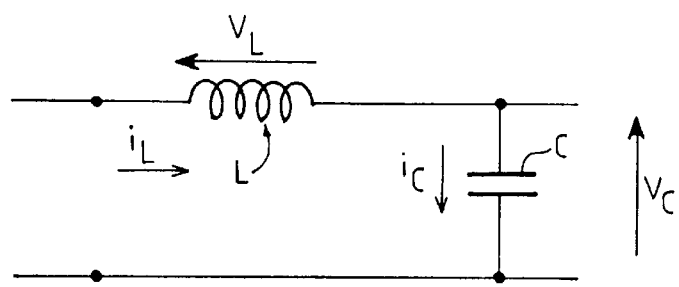
FIGS. 5 and 6 illustrate two examples of simple electronic circuits.

FIG. 5 illustrates the simple case of a quadripole consisting of an inductor L in series, followed by a capacitor C in parallel. The set of differential equations describing this circuit is given by relations (X) in the appendix, where the symbols ' (prime) and " (double prime) respectively designate the time derivatives of orders 1 and 2.

As only the quantities $V_L$ and $V_C$ are measurable, here there remains just a single reduced equation, expressed in (XI).

Figure 6:
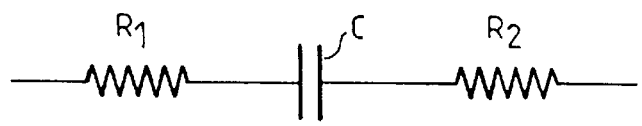

FIG. 6 illustrates another simple case in which a quadripole comprises, in series, a resistor R1, a capacitor C and a resistor R2. The three corresponding reduced equations are expressed in (XII).

Current work shows that this is possible when the theoretical equations are linear.

It is generally possible to integrate (in the mathematical sense) the reduced equations, until first derivative time functions only remain, that is to say an expression of the form given in relation (XIII). It is in this way that the model-relations will be obtained.

The reduced equation (XII) can be expressed directly in this manner, as indicated by expressions (XIV), which give the designations DF and Dg, respectively for the functions f( ) and g( ). (The delimiting quotation marks signify that this is the literal expression of the relevant functions.)

The reduced equation (XI) requires an integration, the result of which is expressed in (XV), assuming that the starting point of the integration is $\Theta_0$. This integration also assumes that the electrical parameters L and C do not vary over time, this generally being true.

The literal expression Df and Dg of the functions f( ) and g( ) of the model-relation corresponding to the reduced equation (XI) is expressed in (XVI). In respect of Df it will be noted that $t_0$ as well as $V'_C(t_0)$ are constants.

More generally, carrying out such integrations will culminate in a function f( ) (possibly in a function g( )) embracing diverse constants, possibly comprising a particular instant (here $t_0$), and values, at this same instant, of successive time derivatives (of diverse orders) of certain of the measurable quantities involved in the model-relation.

IN view of the theoretical equations describing most (electronic or other) components, the person skilled in the art will understand that this culminates mostly in reduced equations which comprise time derivatives up to order 2 (at most). A single integration is then sufficient. However, the treatment of higher-order derivatives, with more than one integration, may be envisaged for certain applications.

It follows from the foregoing that the function f( ) can include an integral, and/or an integral of an integral (up to the necessary degree). The principles of computing over n-tuples given above have shown that it is known how to calculate the integral of an n-tuple.

There remain the constants which the function f( ) may include. A time, such as $t_0$, is immediately available. The values, at a given instant, of time derivatives of measurable quantities can be calculated in a known manner, from the values of the samples initially available in respect of the relevant physical quantity.

Doing the calculations on n-tuple usually requires that the n-tuples be synchronous. It suffices for this purpose to split the operand n-tuples as much as necessary so as to arrive at the situation in which there are only synchronous n-tuples in each operation which requires it.

Formal computation processing required to obtain the model-relations can be carried out a priori, and is therefore not necessarily incorporated into the proposed device. However, a general-purpose diagnostic device will in principle have to be able to calculate the model-relations for a large variety of circuits to be diagnosed. To this end, it will comprise means of formal computation on algebraic functions, their primitives and their derivatives, for the real numbers (within the accuracy limit of computerized processing).

After having devised the models, a base memory (or models memory) 5, is used to store data representing, for each model-relation;

the set of collection $L_p$ of the relevant measurable quantities, or of the measurement points, if a single type of quantity is measured, the model proper which comprises the designations Df and Dg of two functions f( ) and g( ), to be applied according to an equation such as equation (XIII) or an equivalent expression, and the set $L_v$ of the relevant components in this model.

It will be noted that the collection $L_v$ need not necessarily be stored itself, since it can be determined from the function designations Df and Dg.

If the equation is not satisfied (even at a single instant), it follows from this that one at least of the components of the set $L_v$ is defective. Cross-checking several items of information of this kind in order to determine which component is defective is an operation in logic, known to a person skilled in the art (especially through EP-A-408 425).

The designations Df, Dg of the functions f( ) and g( ) can be character strings, or other representations used in software for formal calculation. The designation of a "null" function, for example Df="" implying the identically zero function f( )=0, is allowed.

FIG. 1 illustrates, in the memory 5, the case of a model involving the voltages $V_{p1}$, $V_{p2}$ and $V_{p8}$, for an equation defined by the function designations Df and Dg, concerning the components $c_1$, $c_2$, $c_6$ and $c_8$.

It will be observed in passing that the set of components concerned in the model does not coincide with the collection of measurable quantities.

Preferably, the models are indexed in accordance with an ordered composition of the collection Lp. Thus, the model illustrated in FIG. 1 is denoted "128-0001", to show that this is the first to involve measurement points 1, 2 and 8 ("128"). Subsequent models "128-0002" and so on are available for the same quantities. This extends to all the collections of measurable quantities.

In the processing unit 6, a management unit 60 has available several strips (n-tuples $N_{p1}$, $N_{p2}$, $N_{p8}$) relating to points $p_1$, $p_2$ and $p_8$ of the network, for example.

Preferably, in an adjunct unit 61 are also available initial samples $V_{p1}(t_k)$, $V_{p2}(t_k)$ and $V_{p8}(t_k)$ relating to the same points, or, at least those of these samples which will be necessary later.

The index "128" corresponds to these points of the network. By despatching this index "128" to the memory 5, it acquires one by one the models involving the collection of measured quantities involved, beginning with the model "128-0001". The latter comprises designations Df("128-0001") and Dg("128-0001") of the functions f( ) and g( ), as well as a list of components involved $L_v$("128-0001"). Hereafter the expression ("128-0001")will be omitted.

A unit 62 uses Df to replace therein the constants by their value (if necessary). In the example of relation XVI, "L.C. $V'_c(t_0)$" is calculated, where L and C are intervals coming from the memory 5, while the first time derivatives of $V_C$ at $t_0$ must be calculated in the form of an interval from samples suitably chosen from the memory 61, bearing in mind the margin of uncertainty allowed. This calculation will multiply three n-tuples of order zero, thus giving an n-tuple of order zero. In practice, the product "L.C." will already be calculated in Df and expressed in the form of an interval.

A unit 63 does likewise with Dg, as the case may be.

After this, units 64 and 65 will respectively calculate in the form of n-tuples the functions f( ) and g( ), now using the n-tuples of the measured quantities, here $N_{p1}$, $N_{p2}$ and $N_{p8}$. The results are one n-tuple Nf (at least) and one n-tuple Ng (at least). In practice, there will often be several n-tuples each time, bearing in mind the splittings necessary to do the calculations over synchronous n-tuples (when necessary). Moreover, the n-tuples obtained may be of order greater than 1.

Figure 7:
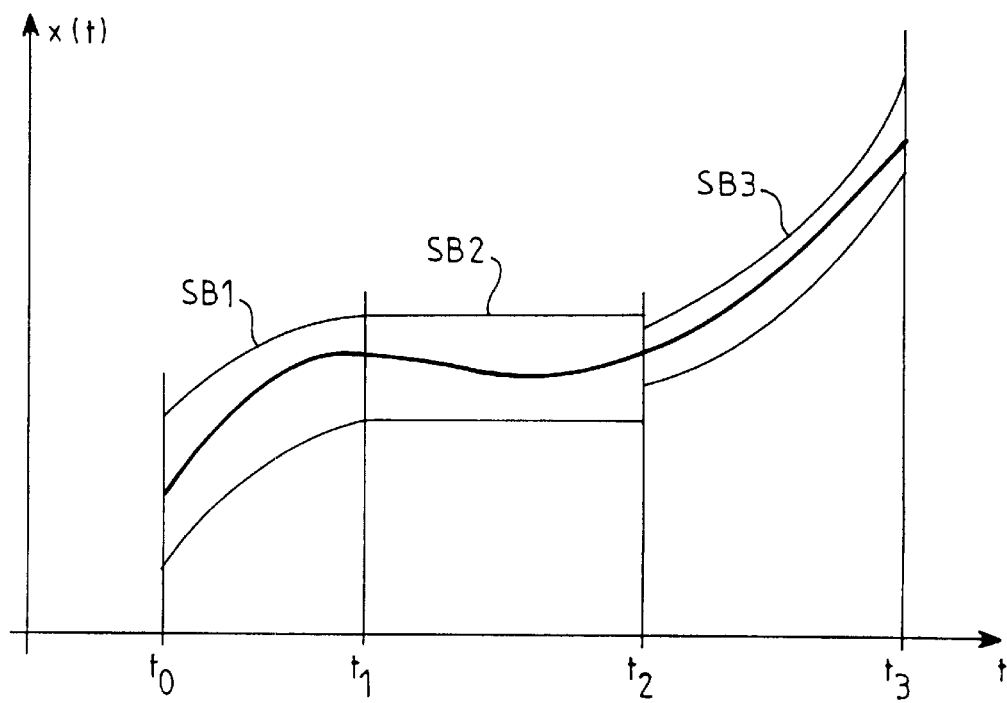
FIG. 7 is an amplitude/time graph illustrating a sequence of n-tuples.

For example, FIG. 7 illustrates a sequence of three n-tuples SB1 (or order 2, the upper and lower profiles are segments of a parabola), SB2 (of order zero) and SB3 (again of order 2).

Another important aspect of the invention now enters.

The Applicant has discovered that it is possible to test (by n-tuples) an expression such as f+g'=0 without examining all of the possible cases. This test is performed in the unit 66. The manner in which the test is conducted depends on the maximum degree of the n-tuples Nf and Ng.

If the expression is satisfied (67) all the components of the list $L_V$ are presumed to be good. In the contrary case, one at least of the components $c_1$, $c_2$, $c_6$ and $c_8$ is bad, as expressed in logic form by relation (XVII), where the symbol ¬ indicates the logical negation of the expression which follows it, while the symbol ∨ is a "logical OR".

The diagnosis finally includes decision logic regarding logical expressions of the same kind, so as to determine the defective component or components.

To this end, it is naturally necessary to scan the various models ("128-0002", etc.) for one and the same group of measurable quantities. This can be done systematically, or steered in accordance with the logical results already acquired, or in any other appropriate manner. This scanning involves an iterative loop going back to the management unit 60 and to its attendant memory 61, which loop is not represented so as not to over-complicate the drawing.

It may happen, for one and the same collection of measurable quantities $L_b$ and of components $L_v$, that one model does not give any error, while another will indicate one.

We shall now return to the functioning of the test unit 66.

Integrated once over the time interval [$\Theta_0$, $\Theta_1$], which may be [$t_0$, $t_1$], relation (XIII) becomes relation (XVIII), wherein appear:
 the integral of the function f( ) over the time interval [$\Theta_0$, $\Theta_1$], and
 the difference $g(\Theta_1)-g(\Theta_0)$.

The variables to be applied to the functions f( ) and g( ) being expressed in the form of n-tuples, it was seen earlier that it is known how to carry out the operations of integration and the algebraic operations on n-tuples. It is therefore possible to perform a calculation of n-tuples on an expression of the type defined in (XVIII).

The Applicant has then observed that this working on n-tuples exhibits an essential advantage.

When the useful quantities are defined by their temporal samples, it is necessary to verify sample by sample (bearing in mind the uncertainty) that none of the samples is incompatible with the model involved. The complexity of the prior diagnostic mechanisms results from this.

With the n-tuples, it becomes possible, in numerous cases, to determine more rapidly (without exhaustive analysis of all the points contained in the envelope) whether an expression such as that of relation (XVIII) is or is not compatible ("consistent") with the n-tuple or n-tuples presented.

Figure 8A:
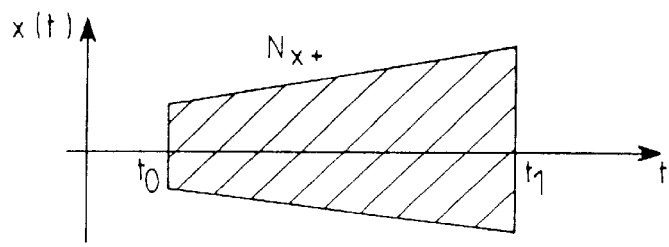
FIGS. 8A and 8B are two other amplitude/time graphs relating to the n-tuples.
Figure 8B:
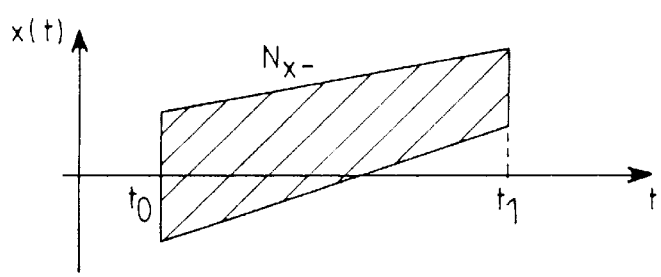

FIGS. 8A and 8B illustrate this in the case of n-tuples of order 1. We have an n-tuple $N_x$, representing the temporal variation x(t) of a quantity x from $t_0$ to $t_1$. It is understood that:
 the n-tuple $N_{x+}$ is compatible with the expression x=0, since, over the whole interval [$t_0$, $t_1$], the envelope contains the value x=0;
 conversely, the n-tuple $N_{x-}$ is not compatible with the expression x=0, since, over the part of the interval [$t_0$, $t_1$] close to $t_1$, the envelope does not contain the value x=0.

The purpose of the test is to compare, at all points of [$t_0$, $t_1$], the sign of the equation defining the lower part of the envelope (coefficients $a_i$), with the sign of the equation defining the upper part of the envelope (coefficients $a_s$).

With the n-tuples, this test becomes: does one at least of the two polynomial equations in $a_i$, respectively in $a_s$, admit of a solution over the time interval [$t_0$, $t_1$]?

It remains to examine what will be the degree of the result n-tuple corresponding to an equation having the standard structure of relation (XVIII).

The operations on n-tuples do not change their order or their degree, except for
 the integral function (with a variable bound), which increases the degree by one unit, and
 the multiplication of two n-tuples, neither of which is of order zero, since the order of the result is equal to the sum of the orders of the operand n-tuples.

We start from a physical model—relations (XI) or (XII) for example. In this model, the highest-order derivative is of order "n", with n=2 for relation (XI) and n=1 for relation (XII).

To arrive at the standard structure (n−1) integrations are necessary.

Moreover, in the functions f( ) and g( ):
 the electrical parameters (resistances, capacitances, etc.) are defined by intervals or by scalars (physical constants in particular), it is currently preferred that the physical quantities entering as variables be defined by n-tuples of order 1.

Bearing in mind the products of quantities which may enter, the resulting degree of f( ) and g( ) may increase. However, it will remain low in the large majority of cases, and even very often equal to one or zero (for example, the n-tuple stating that "a voltage is constant, to within uncertainty").

Figure 9:
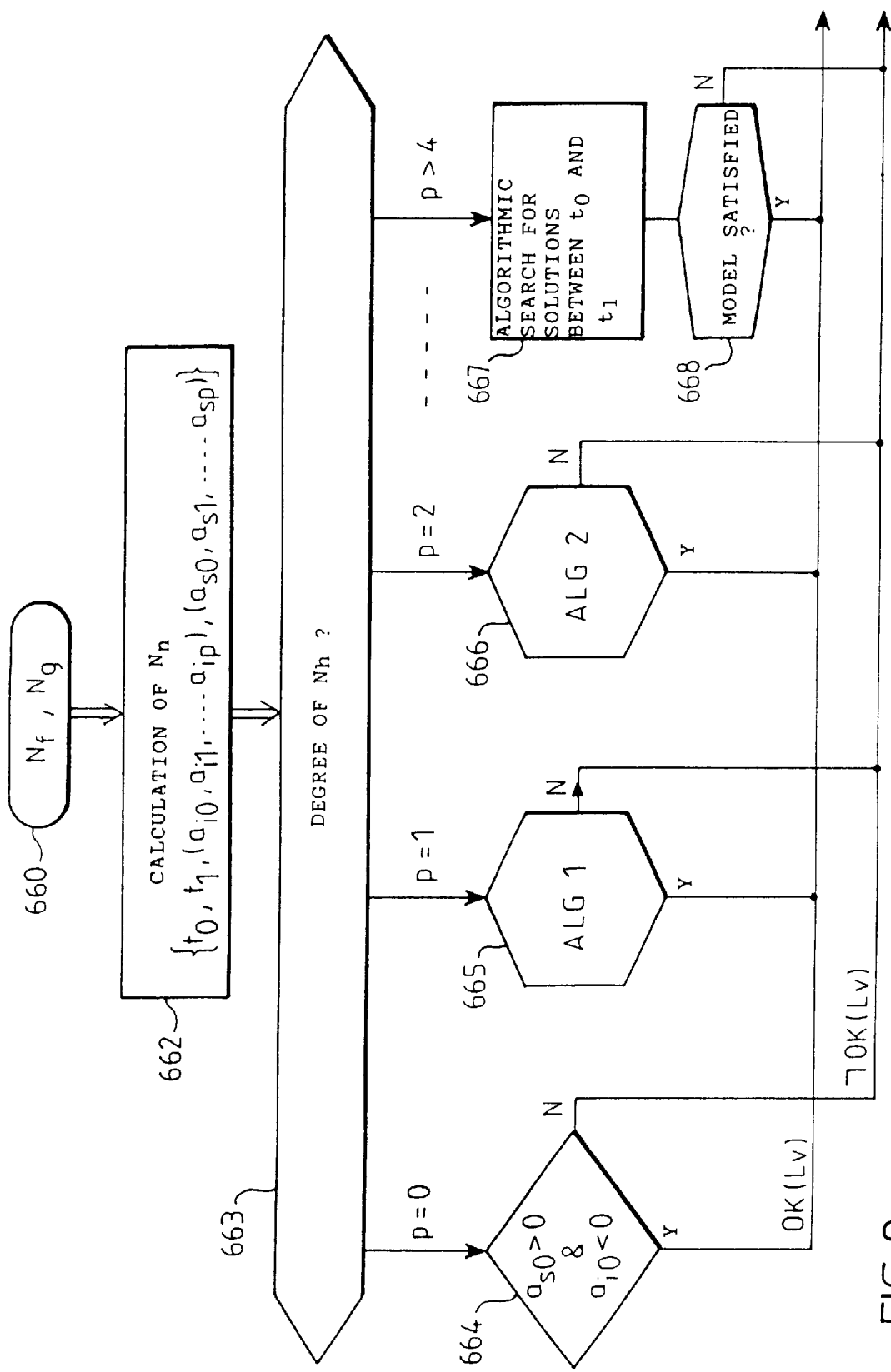
FIG. 9 is a more detailed layout of the test unit 66.

It is understood (FIG. 9) that the test unit 66 must establish an n-tuple Nh (step 662) from the n-tuples Nf and Ng (step 660). Implicitly, account is taken of the integration which transfers from equation (XIII) to equation (XVIII); nevertheless, this does not change the calculation of the n-tuple Nh. Subsequently, the degree of Nh can be directly determined (step 663) from the degrees of Nf and Ng, since it is the maximum out of the degree of Ng and the degree of Nf+1. The unit 66 will then call up the tool for solving polynomial equations, appropriate for this degree, so as to determine whether the equations of the lower or upper curves of the envelope of the n-tuple Nh admit of solutions over the time interval $[t_0, t_1]$.

Up to polynomials of degree 4, which it is known how to solve analytically, the test is simple. For degree 0, we simply compare $a_{s0}$ and $a_{i0}$ with 0 (step 664). For the n-tuples of degree 1, the test is still very simple, since it suffices (ALG 1) to investigate whether one of the reals $(-a_{i0}/a_{i1})$ and $(-a_{s0}/a_{s1})$ lies in the interval (of reals) $[t_0, t_1]$ (step 665). For p=2 (or 3 or 4), the same (ALG 2, etc.) is done with the well-known analytical solutions of the equation of second degree, in step 666 (respectively of third and of fourth degree).

With polynomial equations of degree greater than 4 (which will be fairly exceptional case), it is necessary to resort to numerical solution algorithms as already indicated, which are applied so as to find out whether a solution exists in the time interval $[t_0, t_1]$, in step 667. The test 668 delivers the output from the unit 66 depending on whether or not there is a solution (which need not necessarily be calculated).

In practice, suitable safety margins may be placed in these calculations, which are carried out on real numbers. This is regarded as within the scope of a person skilled in the art.

Ambiguities may appear with regard to the processing operations carried out in the unit 66 itself: for example, is the crossing through zero of the lower curve of FIG. 8B due to choosing envelopes which are too wide upstream?

As several models are available for each set of components $L_v$ to be diagnosed, there will often be another model-relation to indicate whether or not there is a defective component in the set $L_v$. In the absence of such a complementary indication (or for other reasons), it will be possible to recommence the processing of the model-relation in progress, by choosing a sequence of n-tuples which more closely envelopes the measurable quantities involved. However, an envelope which is too near to the uncertainty limits entails a risk of erroneous diagnosis.

In other words, instead of stating "true" (OK($L_v$)) or "false" (¬OK($L_v$)), the output from the unit 66 will be able to allow a third output "uncertain"; it could also state in the form of a kind of "probability" that the collection of components $L_v$ contains at least one defective component.

The foregoing assumes that the unit 66 calculates the n-tuple Nh. This may result in an excessive widening of the envelope which this n-tuple constitutes.

This difficulty is lessened, with model-relations having the structure of equation (XVIII). The preferred functioning of the unit 66 will now be described, in the given example, with two functions f( ) and g( ).

SB1 and SB2 denote two temporal n-tuples or strips. The model is globally compatible with this pair SB1, SB2 if and only if there exist two functions F1( ) and G1( ), respectively bracketed by SB1 and SB2, and satisfying relation (XX), where ∧ represents logical AND: for any two instants $t_a$, $t_b$, lying, in this order, in the time interval $[t_0, t_1]$, relation (XVIII) is satisfied by replacing therein $t_0$ by $t_a$, and $t_1$ by $t_b$, f( ) by F1( ) and g( ) by G1( ).

n-tuples SB1 and SB2 of order 1 are defined by relations (XXI). It may be shown that, in this case, the values which may be taken by the function H1 of relation (XX), for all functions F1 and G1, but for a given pair of instants $t_a$ and $t_b$, lie in the interval given by relation (XXII).

The satisfying of the model, for the two n-tuples SB1 and SB2 of order 1 therefore reduces to the satisfying of the four conditions of the relations (XXIII). They state that, whatever $t_a < t_b$ is in the interval $[t_0, t_1]$, the minimum of the bracketing of H1 is positive and its maximum is negative. Relations (XXIII) again contain a search for the solutions of an equation of degree 2 (the degree of the input n-tuples +1), over the interval $[t_0, t_1]$.

This formulation is not fundamentally different from the calculation of the n-tuple Nh, such as stated earlier. The calculation is simply more direct.

Of course, an integration is avoided in the case in which the function g( ) is identically zero (only f( ) enters the model).

The same process can naturally be used if SB1 and SB2 are of order greater than 1.

In the foregoing it is assumed that SB1 and SB2 each consist of a single n-tuple, respectively Nf and Ng.

Figure 3:
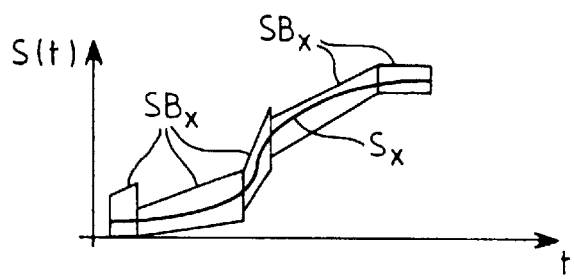

However, when a block of input samples is described by a single n-tuple of degree 1, the envelope must be wide; it will often be preferable to use a sequence of n-tuples so that the envelope is closer fitting (FIG. 3). Henceforth it will be necessary to process a sequence of n-tuples Nf and a sequence of n-tuples Ng (in other words, a sequence of n-tuples for Nh) at the level of the unit 66.

It then remains to describe how the unit 66 functions in the case where Nf and/or Ng (hence Nh) consist of a sequence of n-tuples.

Two synchronous sequences SB1 and SB2 of n-tuples $Nf_u$ and $Ng_u$ are therefore considered, with u going from 1 to r. The n-tuples $Nf_1$ and $Ng_1$ are defined over the time interval $[t_0, t_1]$; the n-tuples $Nf_2$ and $Ng_2$ are defined over $[t_1, t_2]$, and so on up to $Nf_2$ and $Ng_r$ defined over $[t_{(r-1)}, t_r]$. We put q=(r-1).

The problem is of the same nature as that which was dealt with earlier. However, it is now necessary to work over the whole time interval $[t_0, t_r]$, now covered by sequences of n-tuples.

This problem can be decomposed as pairs of time intervals. We consider the pair of extreme time intervals, namely $[t_0, t_1]$ on the one hand, and $[t_q, t_r]$ on the other hand.

By reasoning as for the functions F1 and G1, above, and with n-tuples of order 1, the Applicant has shown that the model is satisfied if the two relations (XXIV) and (XXV) are satisfied, whatever the $t_a$ in $[t_0, t_1]$, and whatever the $t_b$ in $[t_q, t_r]$. (In these relations, the coefficients $a_i$ and $a_s$ should be supplemented not only with their rank, but also with the rank of the relevant n-tuple; to make the reading thereof easier, only the rank of the n-tuple is subscripted. The coefficient of rank 1 for the polynomial equation of the lower curve is therefore written $ai1_r$ for the n-tuple $Nf_r$, and $bi1_r$ for the n-tuple $Ng_r$.).

In these relations are expressed:

in the 1st line, the integral of SB1 between $t_a$ and the upper bound $t_1$ of $[t_0, t_1]$, in the 2nd line, the integral of SB1 between the lower bound $t_q$ of $[t_q, t_r]$ and $t_b$, in the 3rd line, the integral of SB1 over all the intermediate time intervals from $t_1$ to $t_q$, in the 4th line, the contribution from SB2.

There is therefore reason here to calculate the minimum or the maximum of 4 second-degree functions, and then to tack on the constants. This calculation is simple.

The same procedure can be applied to any pair of time intervals between $t_0$ and $t_r$.

Figure 10:
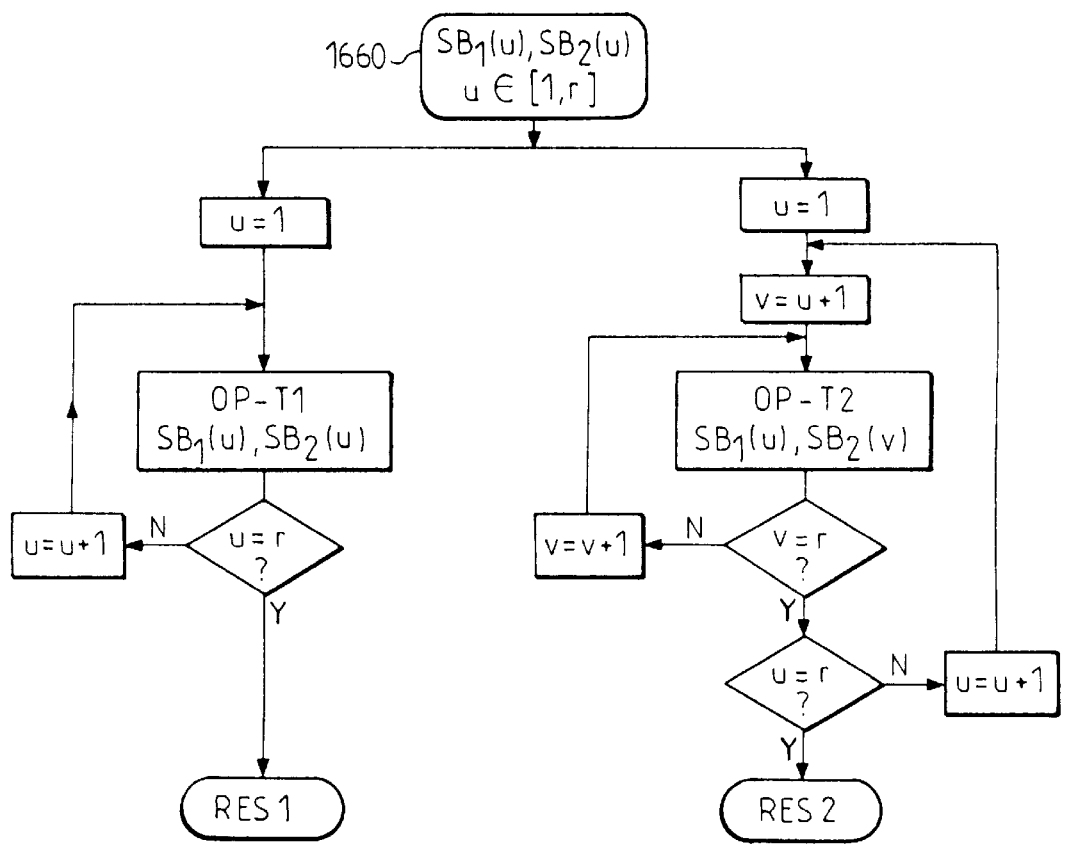
FIG. 10 is another layout relating to the test unit 66.

To verify the model fully with regard to two sequences of synchronous strips SB1 and SB2 it is therefore necessary to provide (FIG. 10):

an operator (OP_T1) which works on each of the pairs of synchronous n-tuples which can be constructed between $t_0$ and $t_r$, such as SB1(u) and SB2(u). It works (r times) according to relations (XXIII), so as to yield a global result RES1, indicating whether the compatibility with the model is violated by one or more of the synchronous pairs, an operator (OP_T2) which also works on SB1 and SB2, but on all the different pairs (not ranked) which can be constructed with the "r" time intervals. It works according to relations (XXIV) and (XXV), doing so r(r−1)/2 times, to yield a global result RES2, indicating whether the compatibility with the model is violated by one or more of the different pairs of time intervals.

Thus, the unit 66 can work fully with regard to two sequences of n-tuples or strips SB1 and SB2.

The above description relates only to the n-tuples of order 1, while n-tuples of higher order have been envisaged. For n-tuples of higher order it is possible:

either to split them into n-tuples of order 1 (short enough for the polynomial curve to be almost akin to a straight line), or to apply the principles asserted above to the higher orders, this being possible but leading to expressions which are too complex to be incorporated into the present description.

The expressions given in the detailed description and in the appendix may appear complex. Calculation thereof is however appreciably faster than the systematic examination of all the samples, according to the prior art.

Moreover, the device described is much more powerful: intrinsically, it takes into account what happens between the samples of the measurements.

Furthermore, the calculations on n-tuples deal particularly well with the problems of derivatives at places where the signal varies rapidly: it suffices to bracket them locally by a close-fitting envelope.

The present invention is naturally not limited to the embodiment described in detail.

For example, provision may be made for certain (at least) of the models to comprise supplementary validity conditions pertaining to values of at least one measured quantity. This supplementary condition is evaluated before applying the model, for example at the level of the management unit. The evaluation may be done by calculation on an n-tuple or by calculation on the initial samples.

Of course, the standard form (XIII) and (XVIII) used to write down the model-relations is not limiting. Any form which is equivalent or constructed according to the same principles may be used.

Additionally, the model-relations could be stored in the integrated form (XVIII), instead of the differential form (XIII). The model-relation then reduces to a single function h( ), as indicated by the right-hand side of relation (XVIII).

This single function h( ) could be defined by a single designation Dh. The person skilled in the art will understand, moreover, that this designation Dh is equivalent to the pair (Df, Dg). Likewise, the resulting n-tuple Nh is equivalent to the pair of n-tuples (Nf, Ng), described above.

With regard to another matter, it is currently preferred to simplify the written expression for the model-relations as far as possible. However, it would be conceivable for the same quantity to appear therein several times, or even, in certain cases, for these model-relations to involve estimated intermediate quantities.

The tools required for the calculations on n-tuples comprise the storage of a few expressions such as all or some of those given in the appendix of formulae and their extensions to higher degrees, especially equations (I) to (VI), and relations (XXIII) to (XXV), as well as the solutions of the polynomial equations of degrees 1 to 4, and numerical algorithms for solving polynomial equations of degree greater than 4, for example. These calculation tools may be built into the means for calculation on n-tuples themselves, or separate.

Although the detailed description above is referred essentially to electronic circuits, it is clear that it is apt for numerous other applications, especially fluid circulation installations, the field of heat science, of mechanics, and more generally any system which can be described at least partially by differential equations, to a sufficient approximation.

Appendix-Formulae (I) to (VIII)

$N \times \{t_0, t_1, (a_{i0}, a_{i1}), (a_{s0}, a_{s1})\}$ $t_0 \leq t_x \leq t_1$ $N \times 1 \{t_0, t_x, (a_{i0}, a_{i1}), (a_{s0}, a_{s1})\}$ $N \times 2 \{t_x, t_1, (a_{i0}, a_{i1}), (a_{s0}, a_{s1})\}$ (I)

$N \times 1 \{t_0, t_1, (a_{i0}, a_{i1}), (a_{s0}, a_{s1})\};$ $N \times 2 \{t_0, t_1, (b_{i0}, b_{i1}), (b_{s0}, b_{s1})\};$ $N \times 1 + N \times 2 = Ny\}t_0, t_1, (a_{i0}+b_{i1}), (a_{s0}+b_{s0}, a_{s1}+b_{si})\}$ (II)

$\{t_0, t_1, (a_{i0}, a_{i1}, \ldots, a_{ip}), (a_{s0}, a_{a1}, \ldots, a_{sp})\}$ $\forall t \in [t_0, t_1];$ $a_{i0}+a_{i1}t+\ldots+a_{ip}t^p \leq x(t) \leq a_{s0}+a_{s1}t+\ldots+a_{sp}t^p$ (III)

$\{[t_0, t_1, (a_{i0}, \ldots, a_{ip}), (a_{s0}, \ldots, a_{sp})\}$ $+\{t_0, t_1, (b_{i0}, \ldots, b_{ip}), (b_{s0}, \ldots, b_{sp})\}$ $=\{t_0, t_1, (a_{i0}+b_{i0}, \ldots, a_{ip}+b_{ip}), (a_{s0}+b_{s0}, \ldots, a_{sp}+b_{sp})\}$ (IV)

$$\int_{\Theta_0}^{t_1} \{t_0, t_1, (a_{i0}, a_{i1} \ldots, a_{ip}), (a_{s0}, a_{s1} \ldots, a_{sp})\} dt =$$ (V)

$$\left\{t_0, t_1, \left(-\sum_{j=0}^{n} a_{ij}\Theta_0^{(j+1)}/(j+1), a_{i0}, a_{i1}/2, \ldots, a_{ip}/(p+1)\right),\right.$$

$$\left.\left(-\sum_{j=0}^{n} a_{sj}\Theta_0^{(j+1)}/(j+1), a_{s0}, a_{s1}/2, \ldots, a_{sp}/(p+1)\right)\right\},$$

-continued $$\int_0^\tau \{t_0, t_1, (a_{i0}, a_{i1} \ldots, a_{ip}), (a_{s0}, a_{s1} \ldots, a_{sp})\} dt = \quad \text{(VI)}$$
$$\{t_0, t_1, (0, a_{i0}, a_{i1}/2, \ldots, a_{ip}/(p+1)),$$
$$(0, a_{s0}, a_{s1}/2, \ldots, a_{sp}/(p+1))\}$$

$$\{t_0, t_1, (a_{i0} b_{i0}, a_{i1} b_{i0}, (a_{s0} b_{i0}, a_{s1} b_{i0})\} \quad \text{(VII)}$$

$$\{t_0, t_1, (a_{i0} b_{i0}, a_{i1} b_{i0}, (a_{s0} b_{s0}, a_{s1} b_{s0})\} \quad \text{(VIII)}$$

Appendix-Formulae (X) to (XVIII)

$V_L = L \cdot i'_L$ $i_c = C \cdot V'_c$ $i_L - i_c = 0$ \quad (X)

$V_L = L \cdot C \cdot V''c$ \quad (XI)

$V_1/R_1 = C \cdot V'c$ $V_2 R_1 = V_2/R_2$ \quad (XII)

$f( ) + g'( ) = 0$ \quad (XIII)

$Df = "V_1/R_1"$ $Df = "-C \cdot V'c"$ \quad (XIV)

$$\int_{\Theta_0}^\tau (V_L - L \cdot C \cdot V''_C) dt = 0 \quad \text{(XV)}$$

$$\int_{\Theta_0}^\tau V_L dt - L \cdot C \cdot V'_C(t) + L \cdot C \cdot V'_C(t_0) = 0$$

$$Df = " \int_{\Theta_0}^\tau V_L dt + L \cdot C \cdot V'_C(t_0)" \quad \text{(XVI)}$$
$$Dg = " - L \cdot C \cdot V'_C(t)"$$

$\neg OK(L_v) = (\neg OK(c_1) \vee \neg OK(c_2) \vee \neg OK(c_6) \vee \neg OK(c_8))$ \quad (XVII)

$$\int_{\Theta_0}^{\Theta_1} f() \cdot dt + g(\Theta_1) - g(\Theta_0) = h() = 0 \quad \text{(XVIII)}$$

Appendix-Formulae (XX) to (XXV)

$$\forall t_a, t_b \in [t_0, t_1], t_a < t_b \wedge \int_{t_a}^{t_b} F1() \cdot dt + G1(t_b) - G2(t_a) = H1 = 0 \quad \text{(XX)}$$

SB1 $\{t_0, t_1, (a_{i0}, a_{i1}), (a_{s0}, a_{s1})\}$;

SB2 $\{\tau_0, t_0, (b_{i0}, b_{i1}), (b_{s0}, b_{s1})\}$ \quad (XXI)

$[a_{i1}/2 (t_b^2 - t_a^2) + a_{i0}(t_b - t_a) + b_{i1} t_b + b_{i0} - b_{s1} t_a - b_{s0},$ $a_{s1}/2 (t_b^2 - {}_a^2) + a_{s0}(y_b - t_a) + b_{s1} t_b + b_{s0} - b_{i1} \epsilon_a - b_{i0}]$ \quad (XXII)

for $t \in [t_0, t_1]$, \quad (XXIII)

Max $(a_{i1}/2 (t^2 - t_0^2) + (a_{i0} + b_{i1}) t - (a_{i0} + b_{s1}) t \; 0 + b_{i0} - b_{s0}) \leq 0$ Max $(a_{i1} 2 (t_1^2 - t^2) + (a_{i0} + b_{i1}) t_1 - (a_{i0} + b_{s1}) t + b_{i0} - b_{s0}) \leq 0$ Min $(a_{s1}/2 (t_{\,2} - t_0^2) + (a_{s0} + b_{s1}) t - (a_{s0} + b_{i1}) t_0 + b_{s0} - b_{i0}) \geq 0$ Min $(a_{s1}/2 (t_1^2 - t^2) + (a_{s0} + b_{s1}) t_1 - (a_{s0} + b_{i1}) t + b_{s0} - b_{i0}) \geq 0$ for $t_a \in [t_0, t_1]$ and $t_b \in [t_q, t_r]$ \quad (XXIV)

$\text{Max}(-ai1_1/2 \; t_a^2 - ai0_1 t_a) + ai1_1/2 \; t_1^2 - ai0_1 t_1 +$ $\text{Max}(ai1_r/2 \; t_b^2 + ai0_r t_b) - ai1_r/2 \; t_q^2 - ai0_r t_q +$ $$\sum_{k=2}^q (ai1_k/2 \; (t_k^2 - t_{k-1}^2) + ai0_k(t_k - t_{k-1}) +$$

$bi1_r t_b + bi0_r - bs1_1 t_a - bs0_1 < 0$ for $t_a \in [t_0, t_1]$ and $t_b \in [t_q, t_r]$ \quad (XXV)

$\text{Min}(-as1_1/2 \; t_a^2 - as0_1 t_a) + as1_1/2 \; t_1^2 + as0_1 t_1 +$ $\text{Min}(as1_r/2 \; t_b^2 + as0_r t_b) - as1_r/2 \; t_q^2 - as0_r t_q +$ $$\sum_{k=2}^q (as1_k/2 \; (t_k^2 - t_{k-1}^2) + as0_k(t_k - t_{k-1}) +$$

$bs1_r t_b + bs0_r - bi1_1 t_a - bi0_1 < 0$

What is claimed is:

1. A device for aiding the diagnosis of a network of components the device comprising:
    input memory storing variables, each variable representing a measurement of a physical quantity made at a known location of the network and stored in the form of n-tuples defining a time interval of the variable and an envelope of the variable over the time interval;
    computing means capable of computing functions on the n-tuples;
    base memory storing definitions of functional models relating to the network, each functional model including a list of components of the network and at least one particular function applicable to the n-tuples representing physical quantities and related to the components in the list of components;
    test means receiving at least one n-tuples, and providing an output relating to the satisfying of a standard expression by the at least one n-tuples; and
    processing means including:
        first receive routine to receive, repetitively, from the input memory at least one initial n-tuples,
        selection routine to select, repetitively, a designation of the definitions of the functional models stored in the base memory and corresponding to the at least one initial n-tuples,
        deploy routine to call, repetitively, the computing means utilizing the at least one initial n-tuples and a particular function related to the selected designation,
        second receive routine to receive, repetitively, from the computing means at least one result n-tuple,
        application routine to apply, repetitively, the at least one result n-tuples to the test means,
        associating routine to associate, repetitively, the output from the test means with the list of components of the selected designation, and
        decision logic, capable of analyzing various outputs from the test means, to determine one or more defective components.

2. The device according to claim 1 wherein the functional models pertain solely to directly measurable quantities.

3. The device according to claim 2 wherein each measurable quantity is applicable at most once into each function designation of the functional model.

4. The device according to claim 1 wherein the envelope defined by each n-tuple is delimited as a trapezoid.

5. The device according to claim 1 further comprising a conversion operator able to transform input measurement values into at least one initial multiplet.

6. The device according to claim 5 wherein the conversion operator is designed to operate an optimization between the number of n-tuples and their span along the ordinate.

7. The device according to claim 1 further comprising means of formal computation on algebraic functions, their primitives and their derivatives, for the real numbers, and such that the computing means of computation on n-tuples deploy the means of formal computation.

8. The device according to claim 1 wherein the computing means of computation over n-tuples are designed to perform:

the composition of n-tuples, so as to segment them and/or concatenate them, thus making it possible to obtain synchronous n-tuples relating to one and the same time interval, the algebraic computations over n-tuples rendered synchronous, the integration of an n-tuple over a part at least of its time interval.

9. The device according to claim 1 further comprising means for receiving a map of a network to be diagnosed, and a generator of model-relations from the map and from physical laws regarding the components of the network.

10. The device according to claim 1 wherein the test means are assigned to a standard structure of differential equations able to receive one of first and second designations of first and second particular functions, and n-tuples relating to the variables of the first and second particular functions, and are designed to yield a logic output relating to the satisfying of the differential equation by the variables.

11. The device according to claim 10 wherein the computing means are capable, for a functional model, of yielding at least one first result n-tuple, for the first particular function designated by the first designation, and n-tuples of measurable quantities which the at least one first result n-tuple involves, and at least one second result n-tuple for the second particular function designated by the second designation, and n-tuples of measurable quantities which the at least one second result n-tuple involves.

12. The device according to claim 11 wherein the computing means yielding a first sequence of the at least one first result n-tuple, for the first particular function designated by the first designation, and a second sequence of the at least one second result n-tuple, for the second particular function designated by the second designation, and the test means further includes:

an operator able to work on a pair of synchronous n-tuples respectively taken from the first and second sequences, and an operator able to work globally on a first pair of synchronous n-tuples from third and fourth sequences and on a second pair of synchronous n-tuples from fifth and sixth sequences, which relates to a time interval whose bounds are respectively associated with the first and with the second pairs of synchronous n-tuples.

13. The device according to claim 1 further comprising means for constructing the map of a network to be diagnosed, and a generator of model-relations from the map and from physical laws regarding the components of the network.

* * * * *